United States Patent [19]

Schreck et al.

[11] Patent Number: 5,022,008

[45] Date of Patent: Jun. 4, 1991

[54] PROM SPEED MEASURING METHOD

[75] Inventors: John F. Schreck; Phat C. Truong, both of Houston, Tex.

[73] Assignee: Texas Instruments Incorporated, Dallas, Tex.

[21] Appl. No.: 450,711

[22] Filed: Dec. 14, 1989

[51] Int. Cl.$^5$ .............................................. G11C 7/00
[52] U.S. Cl. .................................. 365/201; 365/185; 365/104
[58] Field of Search ........... 365/185, 201, 210, 189.07, 365/189.09, 104

[56] References Cited

U.S. PATENT DOCUMENTS

| | | | |
|---|---|---|---|
| 4,441,170 | 4/1984 | Folmsbee et al. | 365/200 |
| 4,577,294 | 3/1986 | Brown et al. | 365/200 |
| 4,630,241 | 12/1986 | Kobayashi et al. | 365/200 |
| 4,740,925 | 4/1988 | Kaszubinski | 365/200 |
| 4,748,597 | 5/1988 | Saito et al. | 365/230 |

Primary Examiner—Joseph A. Popek
Attorney, Agent, or Firm—Ronald O. Neerings; Thomas W. DeMond; Melvin Sharp

[57] ABSTRACT

A method for measuring the access time or speed of PROM devices is described. The PROM (10) includes a matrix of erased memory cells (30-70) each selectable by an address, and readable by a sense amplifier (112). The method comprises providing an invalid address and reading the level at the sense amplifier (112). A valid address is then provided, and the memory cell addressed is read. The above steps are repeated until all memory cells are read. In this manner, the time required to access an erased memory cell after accessing a programmed memory cell, as simulated by a nonexistent memory cell, may be measured.

13 Claims, 2 Drawing Sheets

5,022,008

PROM SPEED MEASURING METHOD

TECHNICAL FIELD OF THE INVENTION

This invention relates generally to programmable memory cells, and more particularly to a method for measuring the speed of programmable memory cells.

BACKGROUND OF THE INVENTION

In order to ensure the performance and quality of their products, semiconductor memory device manufacturers perform a battery of tests on the devices. Among these tests are measurements of device performance parameters. One important device parameter is access speed.

Formerly, PROMs and EPROMs (electrically programmable read only memories) have been tested by actually programming the memory cells, testing the devices, and then erasing the devices by exposure to ultraviolet light for a period of time. To permit the penetration of ultraviolet light, the devices are contained in expensive packaging with light transmitting windows. Although this test method has been somewhat satisfactory, the expense of providing the transparent window packaging has prompted development of alternate test methods.

An apparatus and method to improve the testability of one-time programmable memory devices are described in U.S. Pat. No. 4,740,925, issued to Kaszubinski et al. on Apr. 26, 1988, and assigned to Texas Instruments. Kaszubinski et al. provide an extra row of memory cells which are programmed during testing. Speed measurement is performed by alternately reading memory cells in an extra programmed row and memory cells in the rest of the rows in the device.

However, in a memory device which has segmented memory cell arrays, an extra row of memory cells and its associated decoding circuitry are required for each segment of the arrays. A method is herein provided that does not require the extra row of memory cells and associated circuitry to perform the speed measurement test.

The present invention provides for a method for measuring the speed of PROMs and is directed to overcoming the problems as set forth above.

SUMMARY OF THE INVENTION

In accordance with the present invention, a method for measuring the speed of one time programmable memory devices is provided which substantially eliminates or reduces disadvantages and problems associated with the above-described prior methods.

In one aspect of the present invention, a method for measuring the speed of a programmable read only memory (PROM) is provided. The PROM includes a matrix of erased memory cells selectable by an address, and the memory cells are readable by a level sensing circuit. The method comprises providing an invalid address, and reading the level at a level sensing circuit. A valid address is then provided, and the addressed memory cell is read. In this manner, the access time of an erased memory cell after accessing a programmed memory cell (simulated by not reading any memory cell) may be measured.

An important technical advantage of the present invention is the provision of speed measurement of PROMs and EPROMs in packages that do not permit erasure of the memory cells by ultraviolet light. Another technical advantage of the present invention flows from its provision of speed measurement of PROMs and EPROMs without additional memory cells or circuitry.

BRIEF DESCRIPTION OF THE DRAWINGS

For a better understanding of the present invention and its advantages, reference may be made to the following detailed description in conjunction with the accompanying drawings, in which.

DETAILED DESCRIPTION OF THE INVENTION

Figure 1:
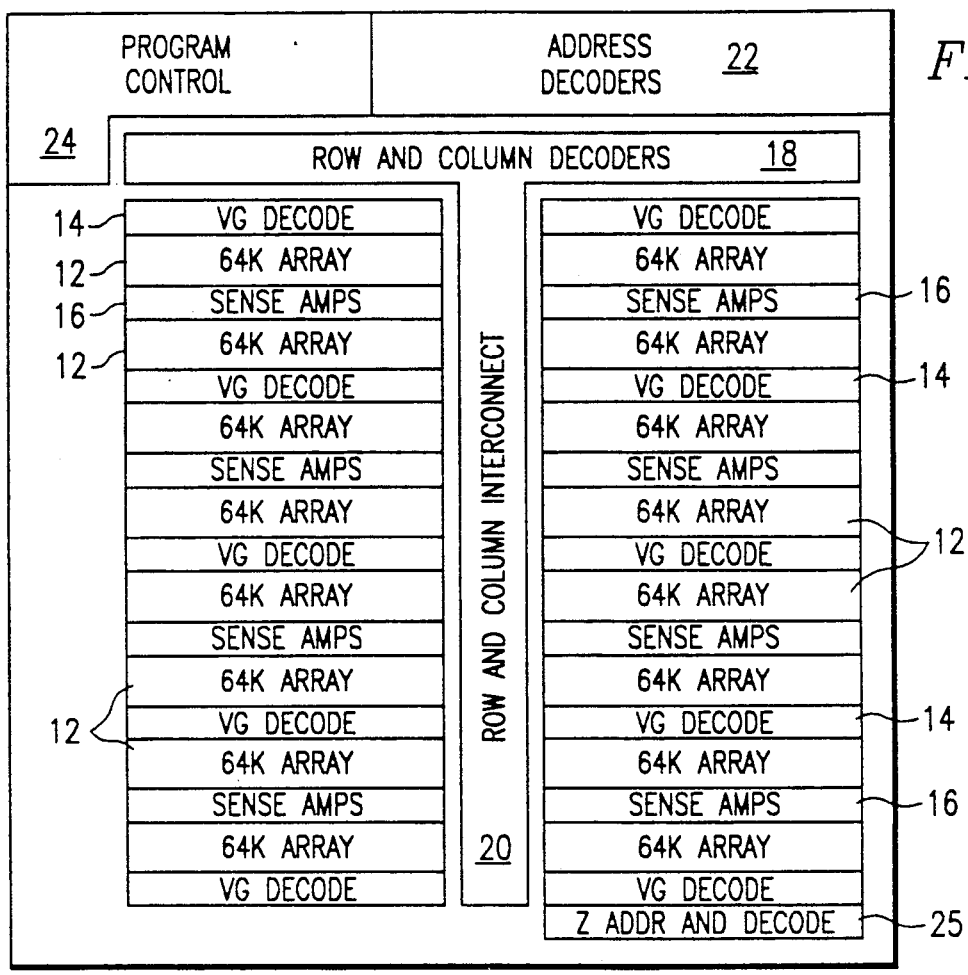
FIG. 1 is a high level schematic block diagram of a one megabyte electrically programmable read only memory incorporating the invention, showing an approximate geographical location of cell arrays and circuit blocks on a chip.

FIG. 1 is a high level schematic block diagram showing central portions of a chip on which a one megabyte complementary metal oxide semiconductor, electrically programmable read only memory array is fabricated. This one megabyte array is indicated generally at 10. Array 10 is organized into sixteen 64K array sections 12. Located between pairs of array sections 12 are a virtual ground decoder section 14 and sense amplifier section 16. Each sense amplifier section 16 contains 32 sense amplifiers, each sixteen of which are associated with an adjacent array section.

In the illustrated embodiment, the array sections 12, together with their corresponding virtual ground decoder sections 14 and sense amplifier sections 16, are organized in a higher-order array of two columns and eight rows. A row and column decoder section 18 is situated at the top of this higher-order array, and is connected to the respective array sections 12, virtual ground decoder sections 14 and sense amplifier sections 16 through a row and column interconnect section 20. An address decoder section 22 has outputs that connect to the adjacent row and column decoder section 18. In the illustrated embodiment, a program control block 24 is situated in the upper left hand corner of the chip. In the illustrated embodiment, a Z address and decoder section 25 is spatially separated from address decoder section 22 and is located in the lower right hand corner of the die 10.

Figure 2:
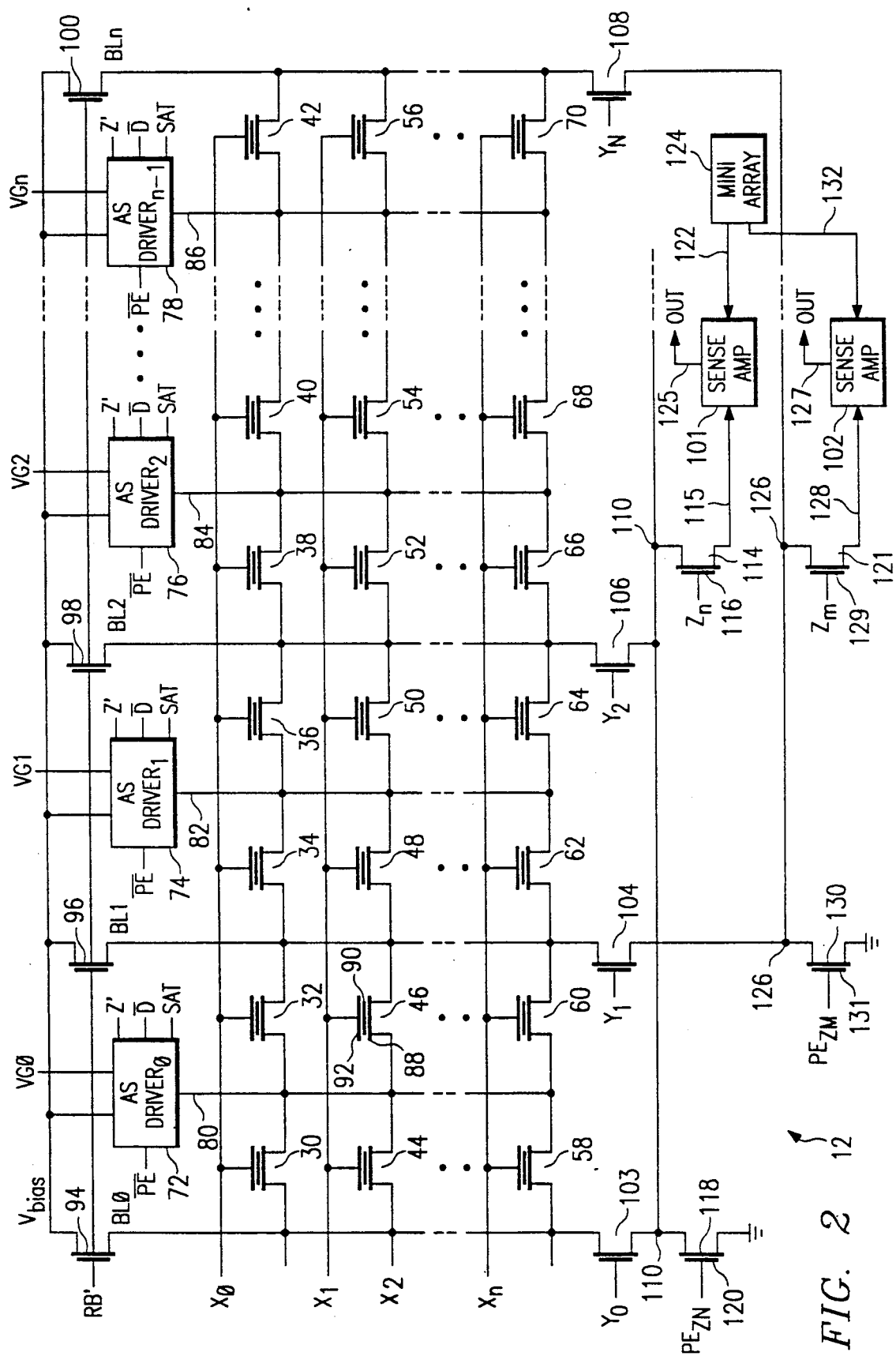
FIG. 2 is a schematic electrical circuit diagram of a small section of one of the cell arrays and associated circuitry shown in FIG. 1.

FIG. 2 is a more detailed electrical schematic diagram of a portion of one of the 64K array sections 12. Shown are a plurality of electrically programmable read-only memory cells 30–70 which are arranged in a plurality of rows and in a plurality of columns orthogonal to the rows. Each row of cells has associated therewith a row or word line X0, X1 . . . Xn. Each pair of columns of cells has associated therewith a bit line such as BL1, BL2 . . . BLn−1. Outside bit lines BL0 and BLn are each associated with only one column of memory cells. Pairs of columns of cells also have associated therewith a respective one of the AS (array source) driver circuits 72–78. Each AS driver circuit 72–78 is connected to a respective decoded or virtual ground signal source VG0, VG1 ... VGn and further to a bias voltage source $V_{bias}$ which, for example, may be 1.7 volts. Each AS driver circuit 72–78 has as an output a respective one of the AS driver lines 80–86 that is connected to the current path of each cell in a pair of columns of cells.

The memory cells 30–70 are constructed to be substantially uniform. Using as an example memory cell 46, each memory cell has a current path 88, a floating gate 90 and a control gate 92. The current path of each memory cell is connected between an AS driver line and an associated bit line. For example, cell 46 has a current path 88 that is connected between the AS driver line 80 and the bit line BL1. The control gate of each memory cell is connected to an associated word line for the row. Using cell 46 again as an example, the control gate 92 thereof is connected to word line X1.

The voltage source $V_{bias}$ is connected to the respective bit lines BL0, BL1, BL2 ... BLn through respective ones of n-channel field effect transistors 94–100. The gates of transistors 94–100 are connected to a read bias voltage supply signal, RB'. Signal RB' is derived from a read bias signal RB (later described) and preferably is about 0.1 volt lower than RB. RB is used within sense amplifiers 101 and 102. The voltage difference between the two signals keeps the bit lines from floating and prevents any interference in the sensing operation, as there will be less current contribution.

N-channel field effect decoding transistors 103–108 have current paths which terminate respective ends of bit lines BL0, BL1, BL2, ... BLn, which ends are opposed to the ends connecting to transistors 94–100. The transistors 103–108 have gates which are respectively connected to Y-decoding signals Y0, Y1, Y2 ... Yn. Transistors 103–108 are divided into even and odd transistor columns, where, for example, transistors 103 and 106 are even and transistors 104 and 108 are odd.

The current paths of even transistors 103, and 106, etc. selectively connect their respective bit lines BL0, BL2, ...BLn−1 (not shown) to a node 110, which in turn is connected through the current path of a field effect transistor 114 and a line 115 to the sense amplifier 101. A gate 116 of transistor 114 is connected to a decoded signal $Z_n$. Node 110 is selectively connected to ground through the current path of a field-effect transistor 118, whose gate 120 is connected to a source of a program enable signal $PE_{zn}$.

The odd transistors 104 through 108 selectively connect their respective bitlines BL1, BL3 ... BLn to a node 126, which in turn is connected through a current path of an n-channel field effect transistor 121 and a line 128 to the sense amplifier 102. A gate 129 of transistor 121 is connected to a decoded signal $Z_m$. Node 126 is also selectively connected to ground through the current path of a field effect transistor 130, whose gate 131 is connected to a source of a decoded program enable signal $PE_{ZM}$. The sense amplifier 102 corresponds to the sense amplifier 101 and compares the signal received on the sense line 128 to a reference value received on a reference line 132 connected to a predetermined point within the miniarray 124.

The sense amplifier 101 compares the signal that it receives on sense line 115 to the signal received on a reference line 122. The reference line 122 is connected to a selected point within a mini-array of (e.g.) 12 read only memory cells. The point in the array to which the reference line 122 is connected is programmable during fabrication such that the state of an operational cell inside the mini-array 124 may be preselected.

In the preferred embodiment of the present invention, sense amplifiers 101 and 102 invert the logic high or low level present at sense lines 115 and 128, respectively, and deliver it to output lines 125 and 127, respectively. In other words, when sense lines 115 and 118 are at a voltage level above the level established on reference lines 122 and 132, respectively, the output lines 125 and 127, respectively are "low". Otherwise, they are "high."

Accordingly, when exemplary sense amplifier 101 is reading an erased or unprogrammed FAMOS memory cell, the level on sense line 115 is "low" and the level on output line 125 is "high." When a programmed FAMOS memory cell is being read, sense line 115 is "high" and output line 125 is "low." This is due to the fact that a FAMOS memory cell does not conduct current when a predetermined amount of electron charge is present on the floating-gate, which is the programmed state. Furthermore, a FAMOS memory cell conducts current when no charge is present in the floating-gate, which is the state of the memory cell when it is erased.

Figure 3:
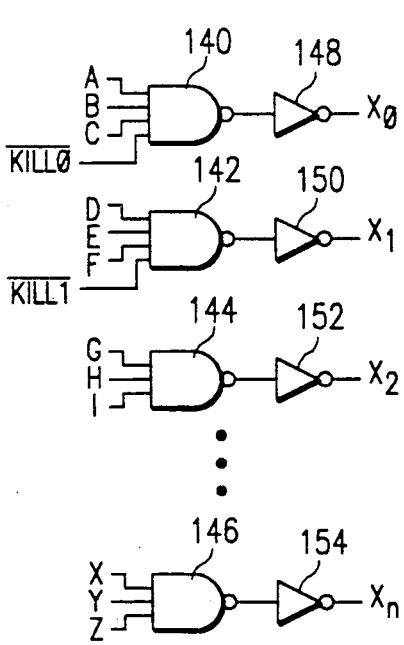
FIG. 3 is a schematic electrical circuit diagram of the address decoding circuitry.

Referring to FIG. 3, a row or word line decoding circuitry for word lines X0, X1...Xn is shown. The word line decoding circuitry is disposed generally in the row and column decoders 18 portion shown in FIG. 1. NAND gates 140–146 are coupled to inverters 148–154, respectively, and their outputs are connected to word lines X0–Xn. Note that a NAND gate and inverter combination gives rise to an AND function as known in the art of Boolean logic.

The NAND gates 140–146 each receive a set of input signals (A,B,C), (D,E,F), (G,H,I), ... (X,Y,Z), respectively. Accordingly, a row or word line may be selected by supplying a particular combination of input signals. For example, word line X2 may be selected by supplying input signals (G=1,H=1,I=1). By selecting a word line, any memory cell in the corresponding row (e.g., one of cells 44–56 in FIG. 2) may be accessed. If a bit line is also selected by supplying a "1" or "high" at the gate of one of transistors 103–108, the memory cell specified by the row and column address (X,Y) is selected and may be accessed. It can be appreciated that NAND gates 140–146 may provide part of the word line decoding function, and that further decoding circuitry may be required to provide decoding down to the word line level. However, this is not in departure from the teachings of the present invention.

In addition to the input signals (A,B,C), NAND gate 140 receives a $\overline{KILL0}$ signal. Similarly, in addition to the input signals (D,E,F), NAND gate 142 receives a $\overline{KILL1}$ signal. $\overline{KILL0}$ and $\overline{KILL1}$ signals serve to disable the decoders for word lines X0 and X1, and to inhibit the selection of word lines X0 and X1, respectively. Whenever one of the $\overline{KILL0}$ and $\overline{KILL1}$ signals is "0" or "low," the corresponding word line X0 or X1 is "0" or "low" independent of the logic level of the input signals. The function of the $\overline{KILL0}$ and $\overline{KILL1}$ signals may be best described by referring to FIG. 4.

Figure 4:
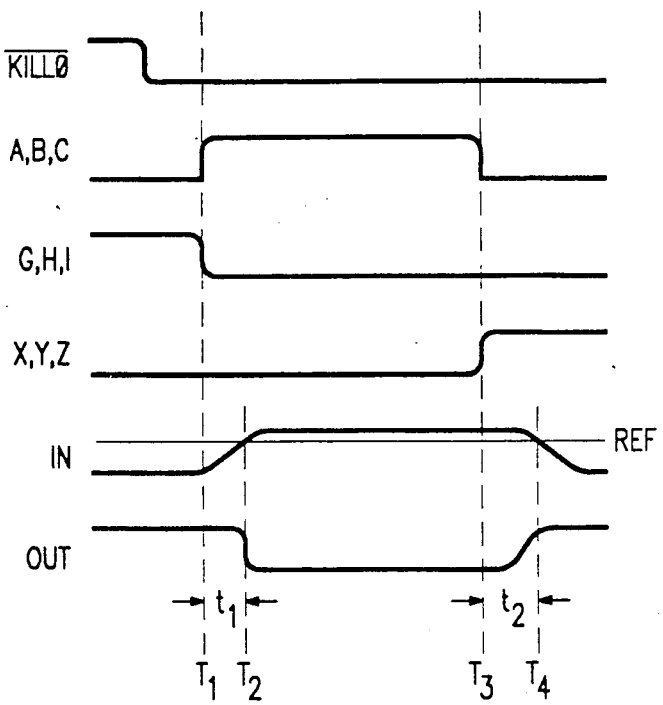
FIG. 4 shows waveforms illustrating the operation of one embodiment of the present invention.

FIG. 4 shows logic level waveforms of the $\overline{KILL0}$ signal, the A,B,C signals jointly, the G,H,I signals jointly, the IN signal at sense line 115 of exemplary sense amplifier 101, and the OUT signal at the output line 125. It is understandable that the present PROM speed measuring method may involve both sense amplifiers 101 and 102 or only one of them.

Prior to time $T_1$, $\overline{KILL0}$ becomes "low". At time $T_1$, input signals G, H and I become "low," deselecting a previously selected word line X2. The "low" IN signal to sense amplifier 101 and the "high" OUT signal reflect the logic level of a particular memory cell in previously selected row X2. The sense amplifier 101 indicates that the logic level of the selected memory cell in row X2 is erased.

At the same time, the A, B and C input signals become "high" to provide an invalid row address. The "low" $\overline{KILL0}$ signal inhibits the selection of row X0, and its corresponding word line is inhibited from going "high." Essentially, by using $\overline{KILL0}$ in combination with input signals (A,B,C), an invalid row address is provided which does not select any row of memory cells.

As discussed previously, EPROM speed measurement is typically performed by alternating readings of an erased memory cell with readings of a programmed memory cell. A memory cell in row X2 was selected and read prior to time $T_1$ by providing input signals (G=1,H=1,I=1). After reading an erased memory cell in row X2, a programmed memory cell must be read to provide a logic level change so that access time may be measured. Since a programmed memory cell does not conduct current, reading it is comparable to not reading any memory cell at all. In other words, reading a programmed memory cell is comparable to reading a memory cell while not having any word line "high," or having any row selected. Therefore, a simulation of reading a programmed memory cell is to not read any memory cell at all. The use of $\overline{KILL0}$ signal provides an invalid address, so that no memory cell is addressed.

At time $T_2$, the IN signal on sense line 115 begins to exceed the voltage level established by the reference line 122, producing a "low" OUT signal on output line 125. The "high" IN signal and the "low" OUT signal indicates that the logic level being read is "high" on programmed, or, as shown in this case, that a nonexistent memory cell has been read. The time lag $t_1$ between $T_1$, when a valid address is deselected and an invalid address is provided, and $T_2$, when the logic level is sensed at sense amplifier 101, is indicative of the time required to access a programmed memory cell after accessing an erased memory cell.

At time $T_3$, input signals (X,Y,Z) become "high" simultaneously, thereby selecting row Xn. A memory cell in Xn is selected and read, and the IN input of sense amplifier 101 falls below the REF voltage level established by the reference line 122 at time $T_4$. The "low" IN signal makes the OUT signal "high" at the same time. The time lag $t_2$, from deselecting an invalid address and providing a valid address (time $T_3$) to detecting the change in logic level at sense amplifier 101 (time $T_4$), is indicative of the access time required to access an erased memory cell after accessing a programmed memory cell. The reading of an erased memory cell by providing a valid address and the reading of a nonexistent memory cell by providing an invalid address is alternated as described above, until all the memory cells are read.

After all memory cells except memory cells in row X0 are read with $\overline{KILL0}$ "low," $\overline{KILL0}$ is made "high" and $\overline{KILL1}$ is made "low" to deselect row X1. The same procedure as described above is repeated, but now with row X1 deselected. In this manner all the memory cells in an array may be tested Therefore, the speed of the PROM may be the maximum time it takes to read a memory cell.

In summary, an EPROM speed measurement method has been described wherein speed measurement may be performed by alternately reading an erased memory cell and a nonexistent memory cell.

Although the present invention has been described in detail, it should be understood that various changes, substitutions and alterations can be made hereto without departing from the spirit and scope of the invention as defined by the appended claims.

What is claimed is:

1. A method for measuring the access speed of a programmable read only memory (PROM) including a matrix of erased memory cells each selectable by an address, said method comprising the steps of:
   producing an invalid internal address so that no memory cell is selected;
   reading a sense level by a level sensing circuit coupled to the matrix;
   timing the interval between said invalid internal address producing step and said reading step;
   producing a valid address for selecting a predetermined memory cell in the matrix;
   reading the sense level by said level sensing circuit;
   timing the interval between said valid address producing step and said reading step; and
   comparing said timed intervals of said invalid internal address and valid address readings; and
   recording the longest time interval, said longest time being the access speed of the PROM.

2. The method, as set forth in claim 1, wherein said step of producing an invalid internal address produces a disable signal to disable an address decoder coupled to at least one row of memory cells.

3. The method, as set forth in claim 1, wherein said step of reading the sense level of a predetermined memory cell comprises the steps of:
   monitoring the sense level of said predetermined memory cell;
   comparing said sense level to a predetermined reference level; and
   providing an output signal in response to said sense level and reference level comparison.

4. The method, as set forth in claim 1, further comprising repeating the steps of claim 1 until all memory cells of the matrix are read.

5. The method, as set forth in claim 4, further comprising the steps of:
   comparing said recorded time intervals for each comparison to produce the longest time interval; and
   recording the longest time interval, said longest time interval being the access speed of the PROM.

6. A method for measuring the access speed of a programmable read only memory (PROM) including a matrix of erased memory cells each selectable by an address, said method comprising the steps of:
   producing a valid address for selecting a predetermined memory cell in the matrix;
   reading the sense level by a level sensing circuit coupled to the matrix;
   timing the interval between said valid address producing step and said reading step;
   producing an invalid internal address so that no memory cell is selected;
   reading the sense level by said level sensing circuit;
   timing the interval between said invalid internal address producing step and said reading step;

comparing said timed intervals of said invalid internal address and said valid address readings; and recording the longest time interval;

repeating the above steps until all memory cells of the matrix are read;

comparing said recorded time intervals for each comparison to produce the longest time interval; and recording the longest time interval, said longest time interval being the access speed of the PROM.

7. The method, as set forth in claim 6, wherein said step of producing an invalid internal address produces a disable signal to disable an address decoder coupled to at least one row of memory cells.

8. The method, as set forth in claim 6, wherein said step of reading the sense level of a predetermined memory cell comprises the steps of:

monitoring the sense level of said predetermined memory cell;

comparing said sense level to a predetermined reference level; and producing an output signal in response to said sense level and reference level comparison.

9. The method, as set forth in claim 6, wherein said step of reading the sense level of a predetermined memory cell comprises the steps of:

monitoring the sense level of said predetermined memory cell;

comparing said sense level to a predetermined reference level; and producing an output signal in response to said sense level and reference level comparison.

10. A method for measuring the access speed of a programmable read only memory (PROM) including an array of erased memory cells arranged in rows and columns, selectable by a combination of a row and a column address, said memory cells readable by a level sensing circuit, said method comprising the steps of:

(a) disabling a first row of memory cells;

(b) producing a first invalid row and column address so that no memory cell is selected;

(c) reading a sense level by a level sensing circuit coupled to said array;

(d) producing a valid row and column address for selecting a nondisabled memory cell;

(e) reading said addressed memory cell sense level by said level sensing circuit;

(f) timing the interval between reading steps c and d;

(g) repeating steps a through f until all rows in said addressed column are read;

(h) repeating steps a through g until all memory cells in all rows and columns except those in said disabled row are read;

(i) disabling a second row of memory cells different from said first row;

(j) producing a second invalid row and column address so that no memory cell is selected;

(k) reading the sense level by said level sensing circuit;

(l) producing a valid row and column address for selecting a nondisabled memory cell;

(m) reading said addressed memory cell sense level by said level sensing circuit;

(n) timing the interval between steps k and m;

(o) repeating steps j through n until all memory cells in said addressed column are read;

(p) repeating steps j through o until all memory cells of all rows and columns except said second disabled row are read; and (q) determining the access speed of said PROM array from said timed reading intervals, said longest time being said access speed of said PROM.

11. The method, as set forth in claim 10, wherein said step of producing an invalid address produces a disable signal to disable an address decoder coupled to at least one row of memory cells.

12. The method, as set forth in claim 10, wherein said step of reading the sense level of a predetermined memory cell comprises the steps of:

monitoring the sense level of said predetermined memory cell;

comparing said sense level to a predetermined reference level; and producing an output signal in response to said sense level and reference level comparison.

13. The method, as set forth in claim 10, further comprising the steps of:

comparing said timed intervals of said invalid address and valid address readings; and recording the longer time interval.

* * * * *